United States Patent
Fang et al.

(10) Patent No.: US 10,163,834 B2
(45) Date of Patent: Dec. 25, 2018

(54) CHIP PACKAGE STRUCTURE COMPRISING ENCAPSULANT HAVING CONCAVE SURFACE

(71) Applicant: Powertech Technology Inc., Hsinchu County (TW)

(72) Inventors: Li-Chih Fang, Hsinchu County (TW); Hung-Hsin Hsu, Hsinchu County (TW); Nan-Chun Lin, Hsinchu County (TW); Shang-Yu Chang Chien, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/600,804

(22) Filed: May 22, 2017

(65) Prior Publication Data

US 2018/0076158 A1 Mar. 15, 2018

Related U.S. Application Data (60) Provisional application No. 62/385,920, filed on Sep. 9, 2016.

(51) Int. Cl.
*H01L 23/00* (2006.01)
*H01L 23/31* (2006.01)
(Continued)

(52) U.S. Cl.
CPC .......... *H01L 24/09* (2013.01); *H01L 21/56* (2013.01); *H01L 21/561* (2013.01);
(Continued)

(58) Field of Classification Search
CPC ..... H01L 24/09; H01L 23/3157; H01L 24/14; H01L 21/56; H01L 21/76802;
(Continued)

(56) References Cited

U.S. PATENT DOCUMENTS 9,165,841 B2* 10/2015 Meyer ............... H01L 22/10
2010/0155937 A1* 6/2010 Hsu .................. H01L 24/06
257/737

(Continued)

FOREIGN PATENT DOCUMENTS

| CN | 103187388 | 7/2013 |
|----|-----------|--------|
| TW | 201133726 | 10/2011 |

(Continued)

OTHER PUBLICATIONS

"Office Action of Taiwan Counterpart Application", dated Sep. 7, 2018, p. 1-p. 5.

*Primary Examiner* — Alexander Oscar Williams
(74) *Attorney, Agent, or Firm* — JCIPRNET (57) ABSTRACT

A chip package structure includes a chip, an encapsulant, a dielectric layer and a patterned circuit layer. The chip includes an active surface and a plurality of pads disposed on the active surface. The encapsulant encapsulates the chip and exposes active surface, wherein the encapsulant includes a concave surface and a back surface opposite to the concave surface, the concave surface exposes the active surface and is dented toward the back surface. The dielectric layer covers the concave surface and the active surface and includes a plurality of openings exposing the pads, wherein the opening includes a slanted side surface and the angle between the slanted side surface and the active surface is an acute angle. The patterned circuit layer is disposed on the dielectric layer and electrically connected to the pads through the openings.

10 Claims, 12 Drawing Sheets

(51) Int. Cl.
*H01L 21/56* (2006.01)
*H01L 21/768* (2006.01)
*H01L 23/498* (2006.01)
*H01L 23/538* (2006.01)

(52) U.S. Cl.
CPC .. *H01L 21/76802* (2013.01); *H01L 21/76877* (2013.01); *H01L 23/3135* (2013.01); *H01L 23/3157* (2013.01); *H01L 23/49816* (2013.01); *H01L 23/5389* (2013.01); *H01L 24/11* (2013.01); *H01L 24/14* (2013.01); *H01L 24/19* (2013.01); *H01L 24/96* (2013.01); *H01L 24/97* (2013.01); *H01L 21/568* (2013.01); *H01L 2224/04105* (2013.01); *H01L 2224/12105* (2013.01); *H01L 2924/3511* (2013.01); *H01L 2924/35121* (2013.01); *H01L 2924/37001* (2013.01)

(58) Field of Classification Search
CPC ............... H01L 21/76877; H01L 24/11; H01L 2924/37001; H01L 2924/35121; H01L 2924/3511; H01L 23/00; H01L 23/31; H01L 21/768
USPC ....... 257/686, 685, 723, 777, 778, 774, 773, 257/737, 738, 734
See application file for complete search history.

(56) References Cited

U.S. PATENT DOCUMENTS

2013/0187285 A1\* 7/2013 Chang .................. H01L 21/561
 257/774
2016/0071779 A1   3/2016 Chen
2017/0200870 A1\* 7/2017 Chen .................... H01L 33/507

FOREIGN PATENT DOCUMENTS

TW            I466259        12/2014
TW            201642403      12/2016

\* cited by examiner

CHIP PACKAGE STRUCTURE COMPRISING ENCAPSULANT HAVING CONCAVE SURFACE

CROSS REFERENCE TO RELATED APPLICATION

This application claims the priority benefit of U.S. provisional application Ser. No. 62/385,920, filed on Sep. 9, 2016. The entirety of the above-mentioned patent application is hereby incorporated by reference herein and made a part of specification.

BACKGROUND OF THE INVENTION

Field of the Invention

The present disclosure generally relates to a package structure and a manufacturing method thereof. More particularly, the present disclosure relates to a chip package structure and a manufacturing method thereof.

Description of Related Art

Semiconductor industry is one of the most developed hi-technology in recent years. With the technology advancing, the hi-tech electronics industries have developed thinner, lighter and more compact products with artificial intelligence and better functions.

In certain categories of conventional packaging technologies, such as fan-out wafer level packaging (FO-WLP), a post-passivation interconnect (PPI) structure (also known as redistribution layers (RDLs)) may be formed over the passivation layers of a die and electrically connected to the bond pads. This is followed by the formation of a dielectric layer and under bump metallurgies (UBMs). The UBMs are formed in openings penetrating through the second polymer and electrically connected to the PPI structure. I/O pads such as solder balls may then be placed on the UBMs. However, an issue with this packaging technology is reliability concerns regarding delamination of the dielectric layer. Delamination issues have been observed in typical FO-WLP wafers subject to various durability tests. These delamination issues may further cause I/O pad breakages in the integrated circuit and reduce the reliability of package and the processing yield.

SUMMARY OF THE INVENTION

Accordingly, the present disclosure is directed to a chip package structure and a manufacturing method thereof, which improve the yield and the reliability of the chip package structure.

The present disclosure provides a chip package structure including a chip, an encapsulant, a first dielectric layer, and a first patterned circuit layer. The chip includes an active surface and a plurality of pads disposed on the active surface. The encapsulant encapsulates the chip and exposes active surface, wherein the encapsulant includes a concave surface and a back surface opposite to the concave surface, the concave surface exposes the active surface and is dented toward the back surface. The first dielectric layer covers the concave surface and the active surface and includes a plurality of first openings exposing the pads, wherein the first opening includes a first slanted side surface and the angle between the first slanted side surface and the active surface is an acute angle. The first patterned circuit layer is disposed on the first dielectric layer and electrically connected to the pads through the first openings.

The present disclosure provides a manufacturing method of a chip package structure including the following steps. A wafer including a plurality of chips formed thereon is provided, wherein each of the chips includes an active surface and a plurality of pads disposed on the active surface. A dicing process is performed on the wafer to separate the chips. A carrier is provided, wherein an adhesive layer is disposed on the carrier. The chips are mounted on the carrier, wherein the active surface and the pads of each of the chips are buried in the adhesive layer, and a top surface of the adhesive layer between the chips is bulged away from the carrier. An encapsulant is formed to encapsulate the chip and cover the adhesive layer, wherein the encapsulant includes a concave surface and a back surface opposite to the concave surface, the concave surface covers the top surface of the adhesive layer such that the concave surface is dented toward the back surface. The carrier is removed by separating the adhesive layer from the chip and the encapsulant. A first dielectric layer is formed to cover the concave surface and the active surface, wherein the first dielectric layer includes a plurality of first openings exposing the pads, and the first opening includes a first slanted side surface and an angle between the first slanted side surface and the active surface is an acute angle. A first patterned circuit layer is formed on the first dielectric layer, wherein the first patterned circuit layer is electrically connected to the pads through the first openings.

In light of the foregoing, in the present disclosure, the chip is mounted on the carrier with the adhesive layer on top, the chips are mounted on the carrier by a force higher than a normal die bond force, such that the chips are partially buried into the adhesive layer and the adhesive layer located between the chips slightly bulges up. As such, the encapsulant formed to encapsulate the chip and cover the bulged-up adhesive layer includes a concave surface dented toward the back surface of the encapsulant due to the bulged-up adhesive layer. Then, the carrier is removed, and the dielectric layer is formed to cover the concave surface of the encapsulant and the active surface of the chip, so the contact surface area between the encapsulant and the dielectric layer is increased, so as to enhance the bonding strength between the encapsulant and the dielectric layer.

In addition, the dielectric layer includes the openings with slanted side surface to partially expose the electrical contacts underneath, and the size of each opening is gradually increased from the bottom end of each opening to the top end of each opening, due to the slanted side surface of the openings, so as to improve the step coverage of the subsequent PVD process for forming the patterned circuit layer and also improve the bonding strength between the patterned circuit layer and the dielectric layer. Therefore, the chip package structure and the manufacturing method thereof in the disclosure improve the yield and the reliability of the chip package structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
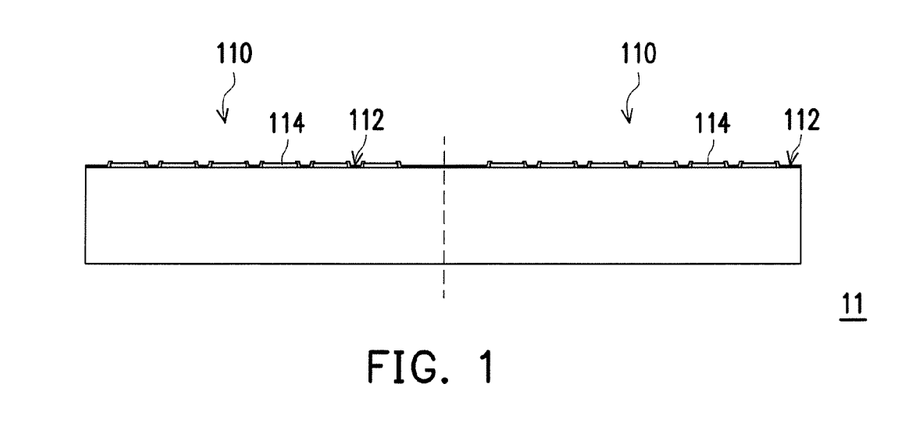
FIG. 1 to FIG. 12 illustrate cross-sectional views of a manufacturing process of a chip package structure according to an embodiment of the invention.

FIG. 1 to FIG. 12 illustrate cross-sectional views of a manufacturing process of a chip package structure according to an embodiment of the invention. In the present embodiment, a manufacturing method of a chip package structure includes the following steps. As shown in FIG. 1, a wafer 11 is provided. The wafer 11 includes a plurality of chips 110 formed thereon. It is noted that two of the chips 110 are illustrated herein, but the number of the chips 110 in the wafer 11 are not limited in the present disclosure. In the present embodiment, the chips 110 may be arranged in an array, and each of the chips 110 includes an active surface 112, a back surface opposite to the active surface 112, and a plurality of pads 114 disposed on the active surface 112.

Figure 2:
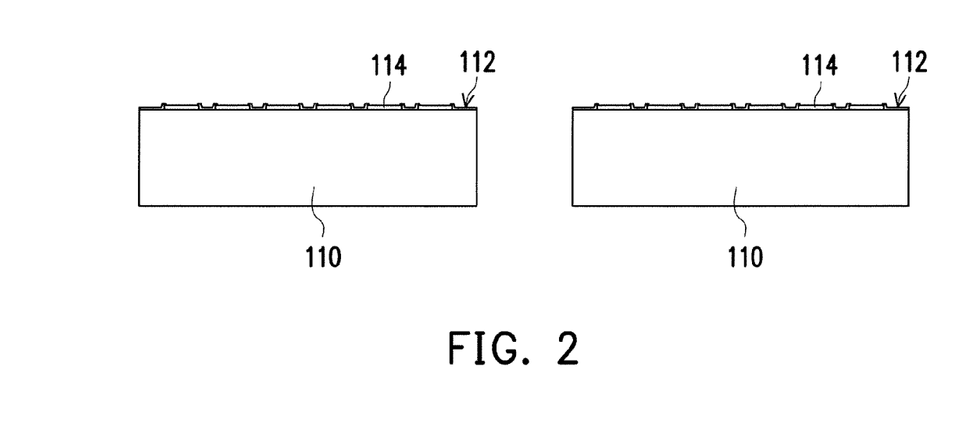
Figure 3:
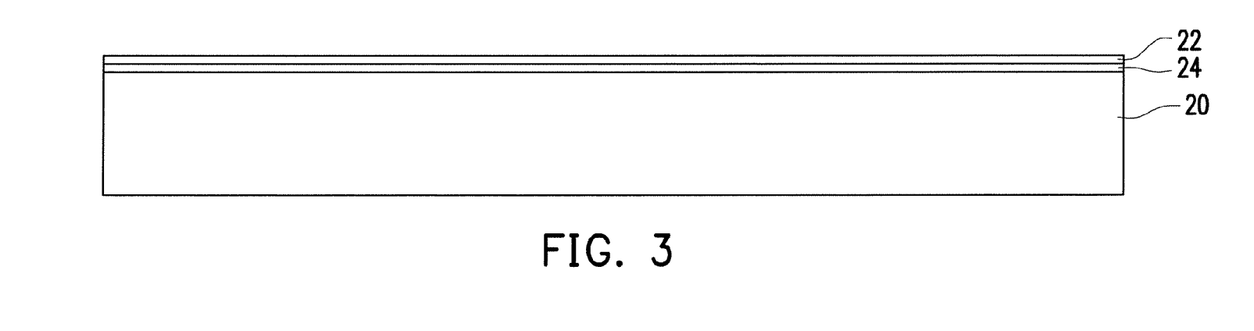

Then, referring to FIG. 2, a dicing process is performed on the wafer 11 to separate the chips 110. A carrier 20 as shown in FIG. 3 is provided, wherein an adhesive layer 22 is disposed on the carrier 20. In the present embodiment, a release layer 24 may be disposed on the carrier 20 before the adhesive layer 22 is disposed on the carrier 20. The release layer 24 may be disposed between the carrier 20 and the adhesive layer 22. The material of the carrier 20 may include glass, ceramics, silicone, metal or any other suitable material for the carrier. The adhesive layer 22 may be a glue or a tape. For example, the adhesive layer 22 may be a liquid-type glue disposed on the carrier 20 by printing, coating or dispensing process. For another example, the adhesive layer 22 may be a tape laminated on the carrier 20. It is noted that the present embodiment is merely for illustration, and the material for the adhesive layer 22 is not limited in the disclosure. The adhesive layer 22 in the disclosure is for temporary adhesion and material for the adhesive layer 22 could be any material that may be used for temporary adhesion.

Figure 4:
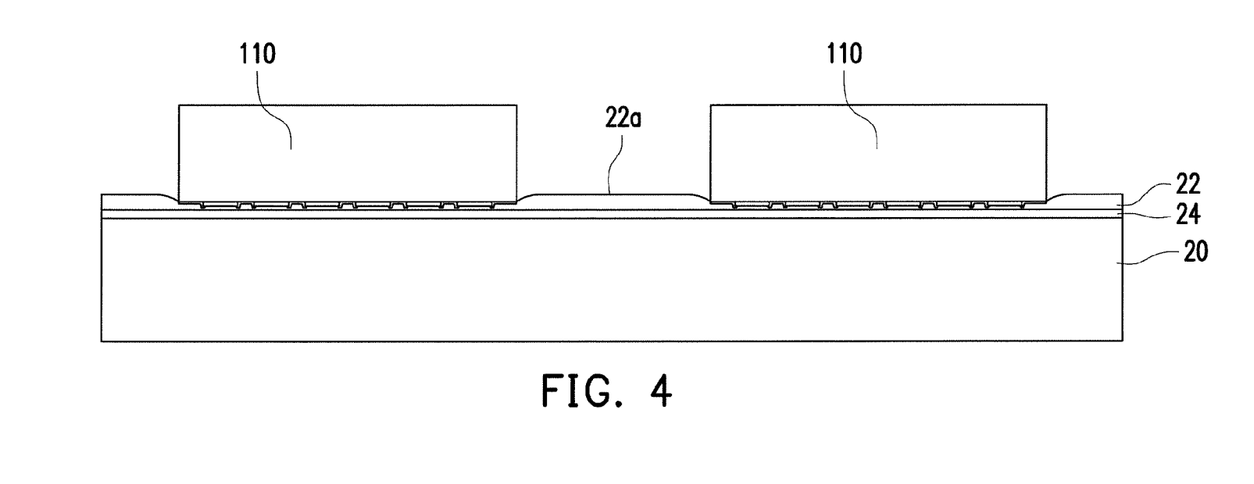

Then, referring to FIG. 4, the chips 110 are mounted on the carrier 20. In the present embodiment, the chips 110 are mounted on the carrier 20 by a force higher than a normal die bond force, such that the chips are partially buried into the adhesive layer 22 and the adhesive layer 22 located between the chips 110 slightly bulges up. The active surface 112 and the pads 114 of each of the chips 110 are buried in the adhesive layer 22, and a top surface 22a of the adhesive layer 22 between the chips 110 is bulged away from the carrier 20 as shown in FIG. 4. In the present embodiment, a maximum distance D1 from the top surface 22a to a surface coplanar with the active surface 112 along a normal direction of the active surface 112 is substantially from 2 μm to 5 μm.

Figure 5:
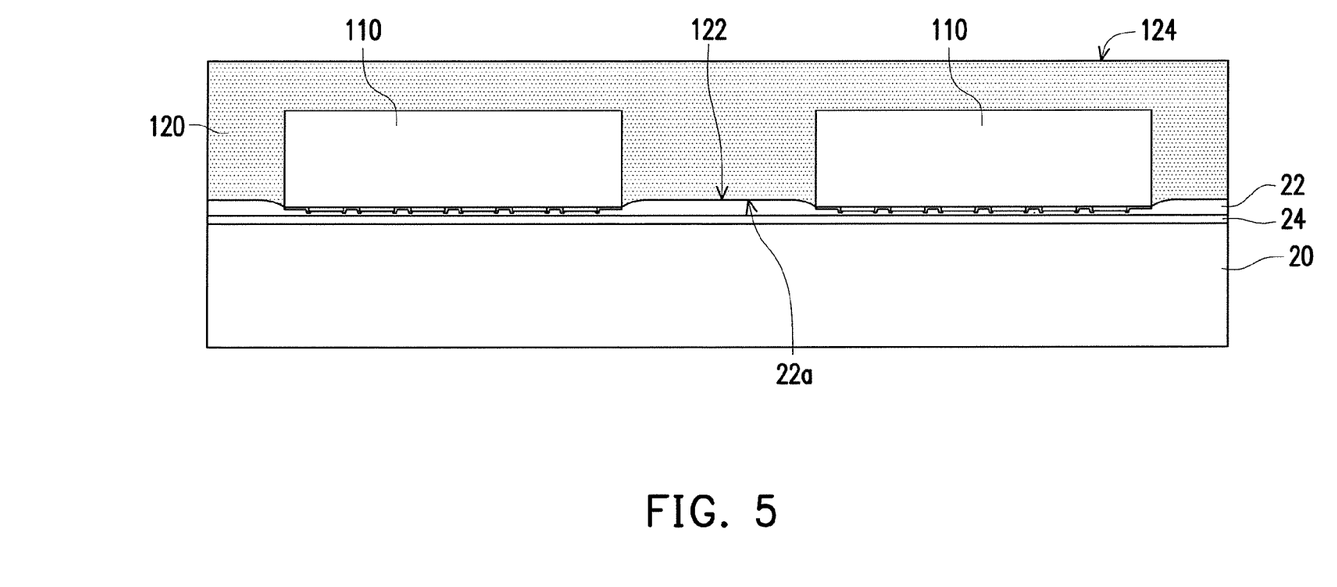

Then, referring to FIG. 5, an encapsulant 120 is formed to encapsulate the back surface and at least one lateral surface of the chip 110 and cover the adhesive layer 22. The encapsulant 120 includes a concave surface 122 and a back surface 124 opposite to the concave surface 122. The concave surface 122 covers the top surface 22a of the adhesive layer 22, such that the concave surface 122 has at least one dent having a curvature toward the back surface 124 according to the top surface 22a of the adhesive layer 20. Namely, the inner surface of the encapsulant 120 contacting the chips 110 and the adhesive layer 22 conforms to the outer surface of the chips 110 and the adhesive layer 22 contacting the encapsulant 120 since the encapsulant 120 encapsulating the chips 110 and the adhesive layer 22.

Figure 6:
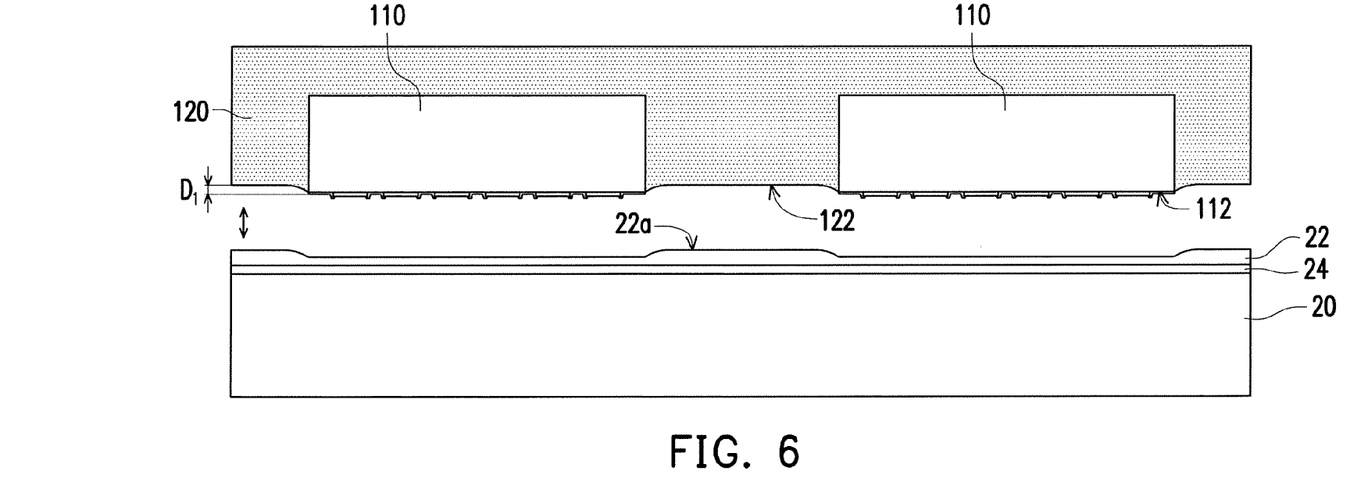

Next, referring to FIG. 6, the carrier 20 is removed by separating the adhesive layer 22 from the chip 110 and the encapsulant 120. A distance D1 from the concave surface 122 to a surface coplanar with the active surface 112 along a normal direction of the active surface 112 may range from 2 μm to 5 μm as shown in FIG. 6. Herein, the normal direction means a direction that is perpendicular to the active surface 112. It is noted that the numerical ranges and the measurements disclosed in the disclosure may vary as the technology evolve. Therefore, different numerical ranges and measurements may be adopted as long as they do not depart from the scope or spirit of the disclosure.

Figure 7:
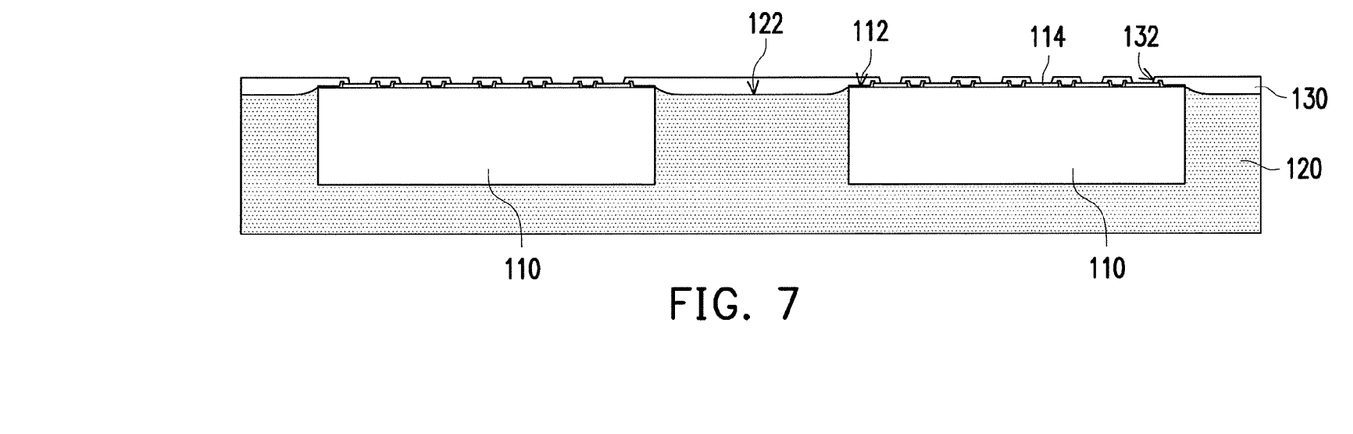
Figure 8:
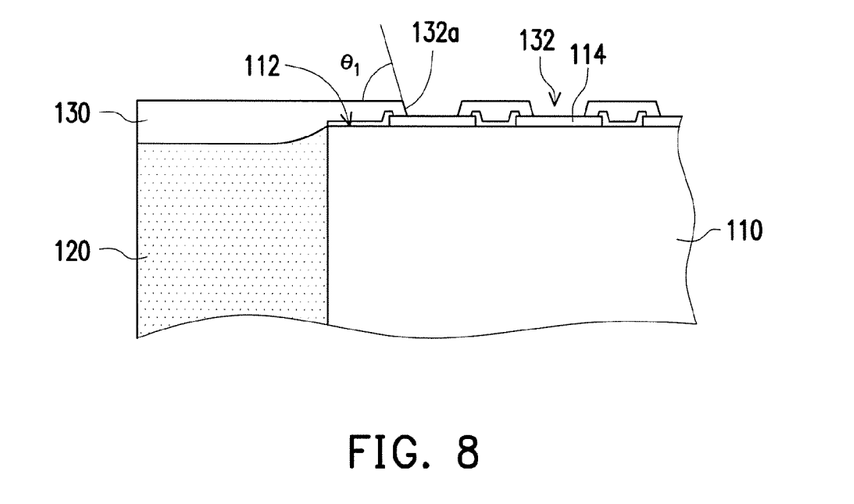

Then, referring to FIG. 7 and FIG. 8, a first dielectric layer 130 is formed to cover the concave surface 122 of the encapsulant 120 and the active surface 112 of the chip 110. Accordingly, the first dielectric layer 130 may include a convex surface conformal and in contact with the entire the concave surface 122. Therefore, the contact surface area between the encapsulant 120 and the first dielectric layer 130 is increased, so as to enhance the bonding strength between the encapsulant 120 and the first dielectric layer 130 and further improve the yield and reliability of the chip package structure in the present embodiment.

A plurality of first openings 132 is formed on the first dielectric layer 130, and the first openings 132 expose the pads 114 of the chip 110 respectively. The first opening 132 includes a first slanted side surface 132a. Namely, the side surface of the first opening 132 is not vertical, but at least slightly tilted, and the first opening 132 is in a taper shape. In the present embodiment, an angle $\theta_1$ between the first slanted side surface 132a and a surface of the first dielectric layer 130 away from the active surface 112 is an acute angle. The angle $\theta_1$ is substantially from 60 degrees to 80 degrees, but the disclosure is not limited thereto.

Figure 9:
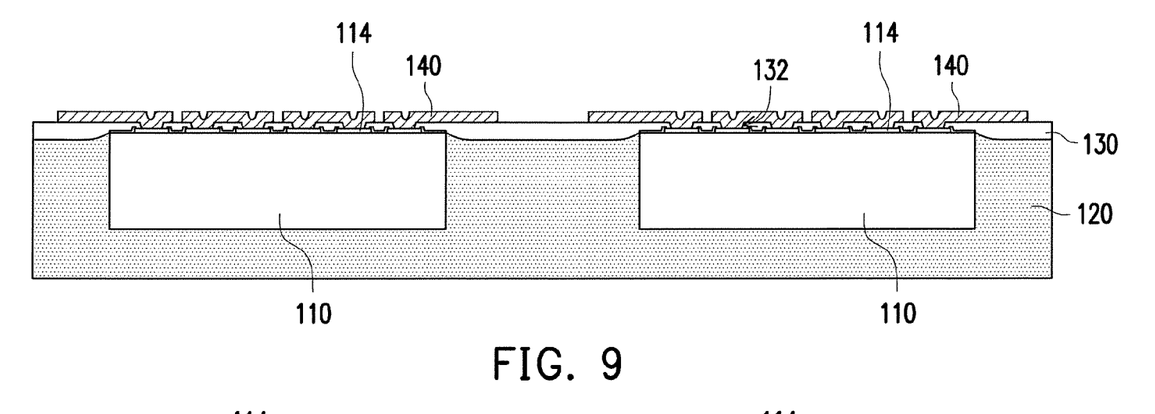

Then, referring to FIG. 9, a first patterned circuit layer 140 is formed on the first dielectric layer 130. The first patterned circuit layer 140 is electrically connected to the pads 114 through the first openings 132. One of the processes for forming first patterned circuit layer 140 includes physical vapor deposition (PVD) process. Evaporated materials may deposit unevenly if the opening of the first dielectric layer 130 has a vertical surface, i.e. a bottom dimension of the opening is equal to a top dimension of the opening. Because the evaporated materials deposit on the substrate mostly from a single direction, protruding features on the substrate block the evaporated material from some areas. Therefore, the first openings 132 having the first slanted side surface 132a allows the size of each first opening 132 being gradually increased from the bottom end of each first opening 132 to the top end of each first opening 132 to improve the step coverage of the PVD process for forming the first patterned circuit layer 140 and also to improve the bonding strength between the first patterned circuit layer 140 and the first dielectric layer 130. As such, the first patterned circuit layer 140 may be formed more uniformly to further improve the yield and the reliability of the chip package structure.

Figure 10:
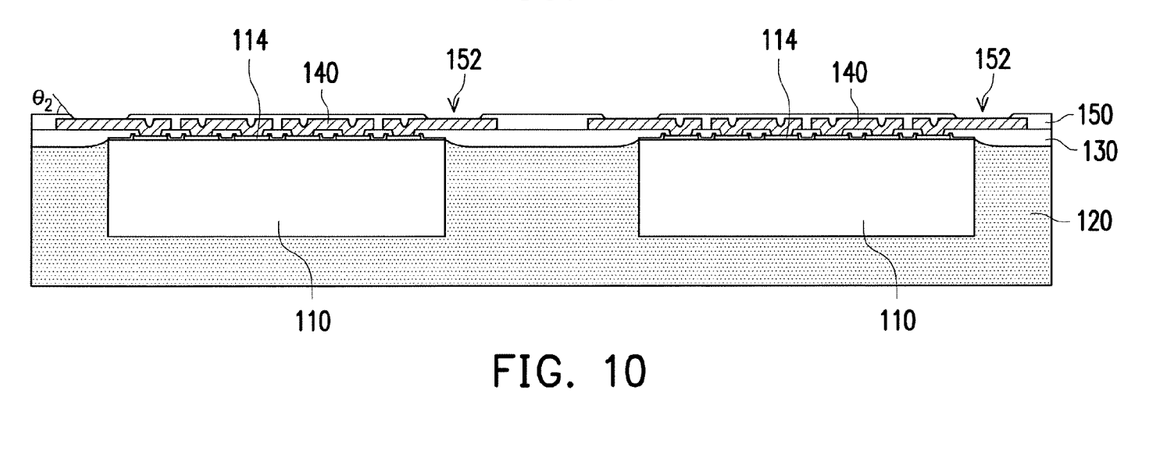

Then, referring to FIG. 10, in the present embodiment, a second dielectric layer 150 is formed on the first patterned circuit layer 140 and the first dielectric layer 130, wherein the second dielectric layer 150 includes a plurality of second openings 152, which expose a part of the first patterned circuit layer 140. The second opening 152 includes a second slanted side surface 152a. In the present embodiment, an angle $\theta_2$ between the second slanted side surface 152a and the active surface 112 is an acute angle. The angle $\theta_2$ is substantially from 60 degrees to 80 degrees, but the disclosure is not limited thereto.

Figure 11:
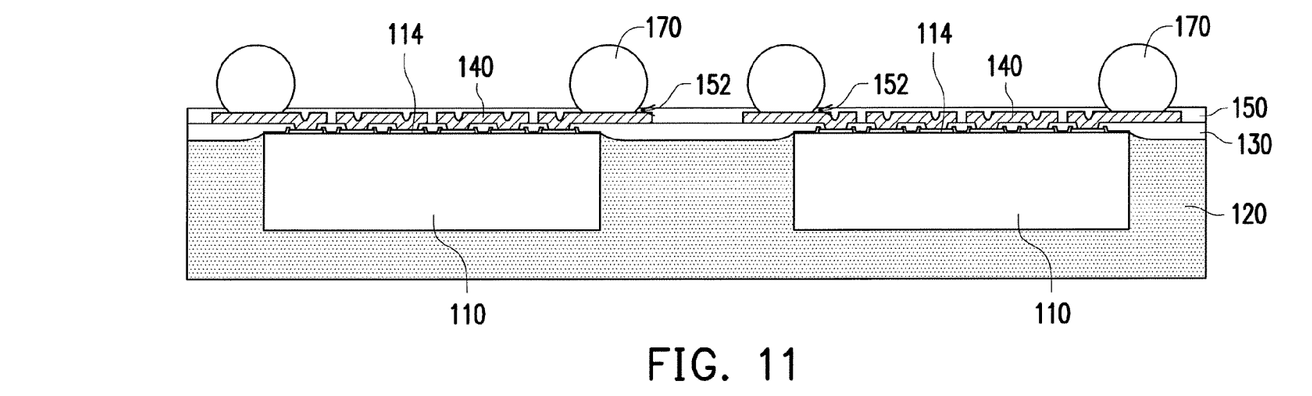
Figure 12:
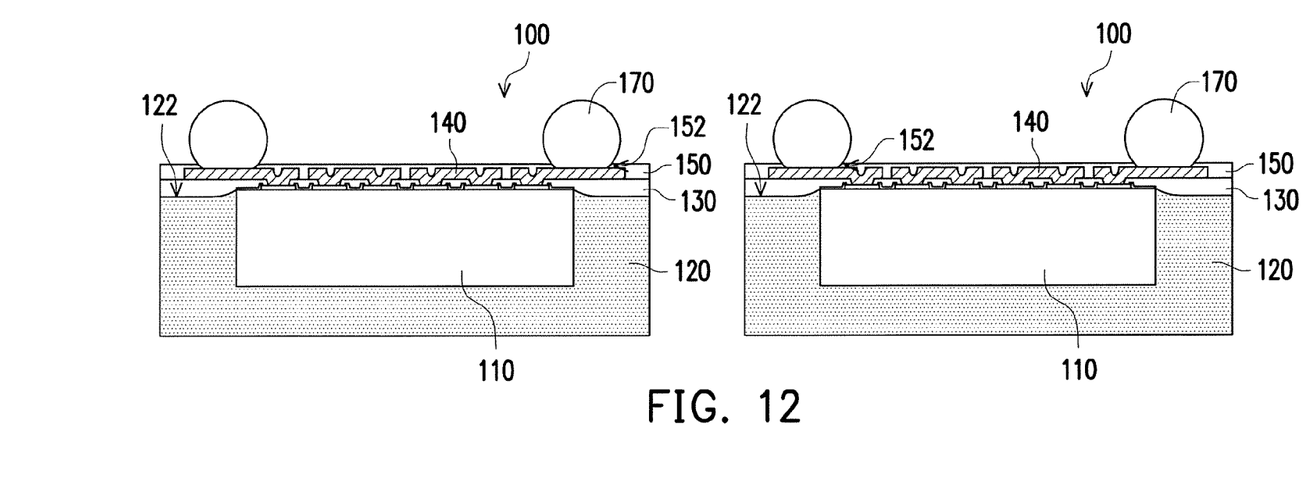

Then, referring to FIG. 11, a plurality of solder balls 170 are formed on the second openings 152 and electrically connected to the first patterned circuit layer 140 through the second openings 152. The second slanted side surface 152a of the second openings 152 increase the contact surface area between the solder balls 170 and the second openings 152, so as to improve the bonding strength between the solder balls 170 and the second openings 152. Next, referring to FIG. 12, a sawing process is performed on the encapsulant 120, the first dielectric layer 130 and the second dielectric layer 150 to form a plurality of chip package structures 100 as shown in FIG. 11. At the time, the manufacturing process of the chip package structure 100 may be substantially done.

Figure 13:
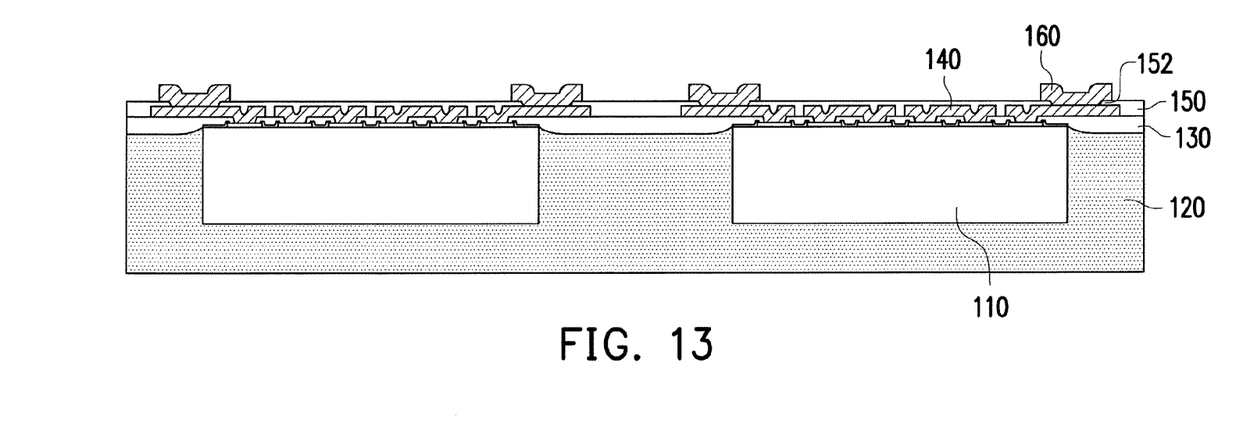
FIG. 13 to FIG. 15 illustrate cross-sectional views of a part of a manufacturing process of a chip package structure according to another embodiment of the invention.
Figure 14:
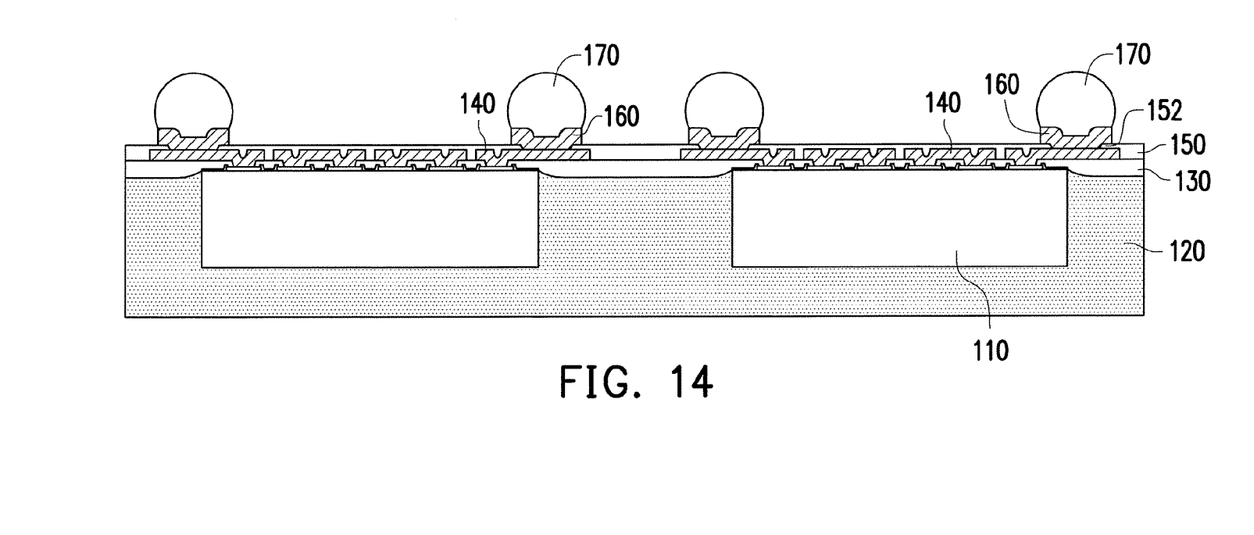
Figure 15:
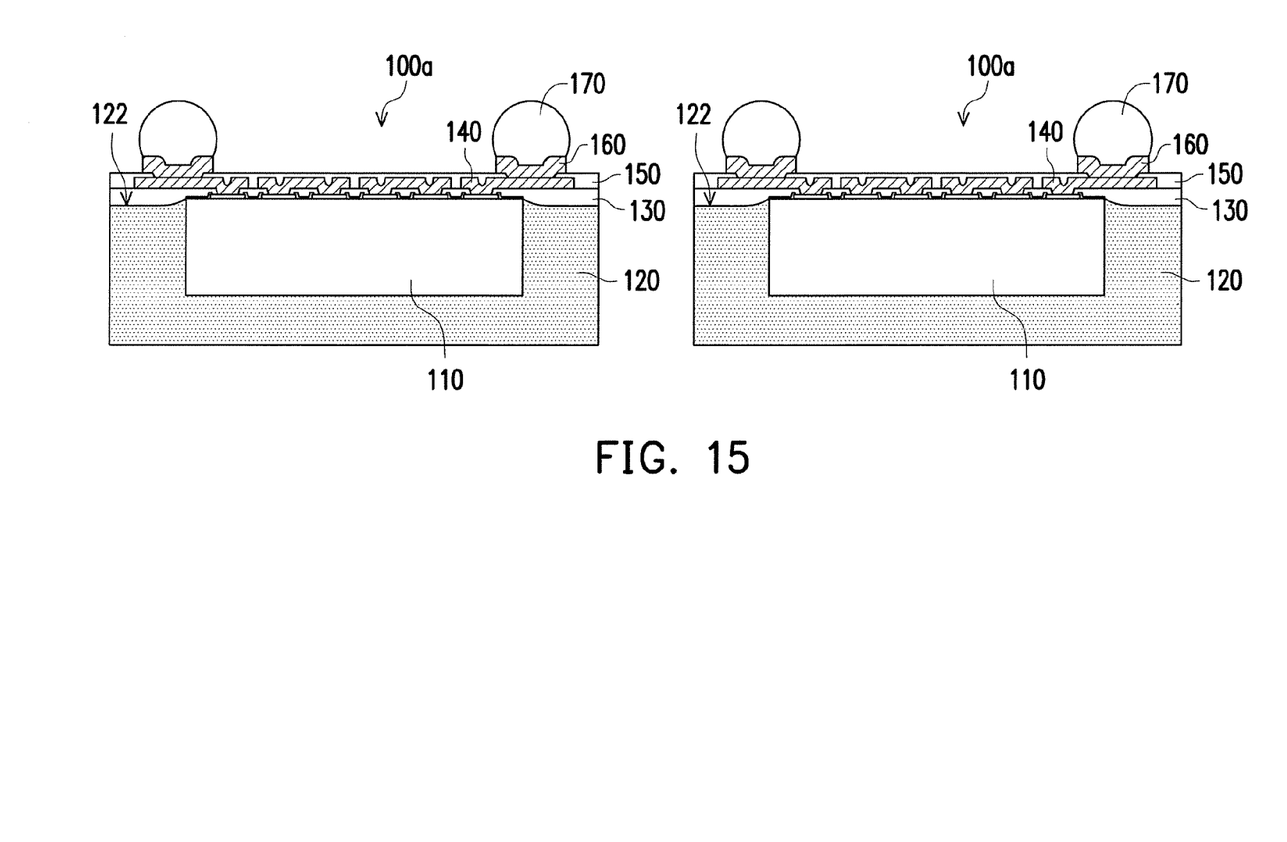

FIG. 13 to FIG. 15 illustrate cross-sectional views of a part of a manufacturing process of a chip package structure according to another embodiment of the invention. It is noted that the manufacturing process of the chip package structure 100 shown in FIG. 1 to FIG. 12 contains many features same as or similar to the manufacturing process of the chip package structure 100a disclosed earlier with FIG. 13 to FIG. 15. For purpose of clarity and simplicity, detail description of same or similar features may be omitted, and the same or similar reference numbers denote the same or like components.

Referring to FIG. 13, in the present embodiment, the main differences between the manufacturing process of the chip package structures 100 and 100a are that, before the solder balls 170 are formed, a UBM (Under Bump Metallurgy) layer 160 is formed on the second openings 152 and the UBM layer 160 is electrically connected to the first patterned circuit layer 140 through the second openings 152. The UBM layer 160 may be formed by PVD process. Therefore, by adopting the second openings 152 with the second slanted side surface 152a, the size of each second opening 152 being gradually increased from the bottom end of each second opening 152 to the top end of each second opening 152, so as to improve the step coverage of the PVD process for forming the UBM layer 160 and also improve the bonding strength between the UBM layer 160 and the second dielectric layer 150. As such, the UBM layer 160 may be formed uniformly, so as to further improve the yield and the reliability of the chip package structure 100a.

Then, referring to FIG. 14, a plurality of solder balls 170 is disposed on the UBM layer 160, and the solder balls 170 are electrically connected to the UBM layer 160. Next, referring to FIG. 15, a sawing process is performed on the encapsulant 120, the first dielectric layer 130 and the second dielectric layer 150 to form a plurality of chip package structures 100a as shown in FIG. 15. At the time, the manufacturing process of the chip package structure 100a may be substantially done.

Figure 16:
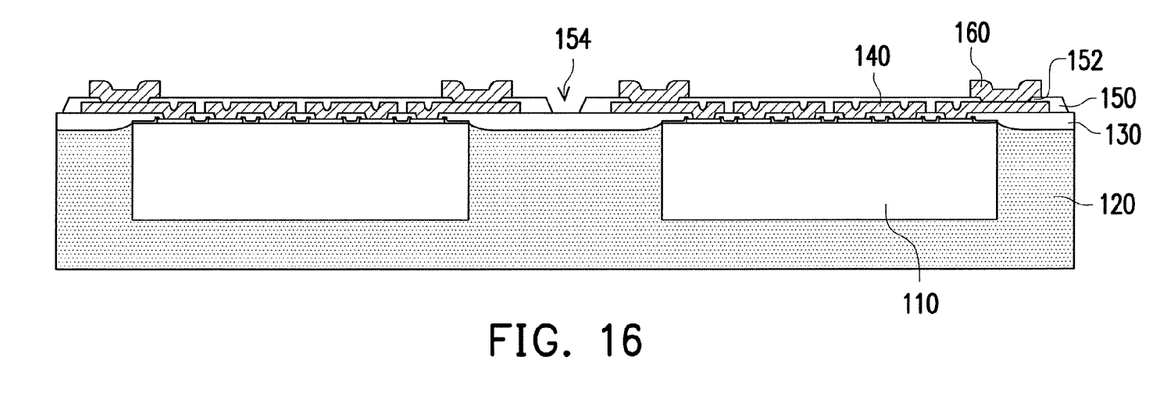
FIG. 16 to FIG. 18 illustrate cross-sectional views of a part of a manufacturing process of a chip package structure according to another embodiment of the invention.
Figure 17:
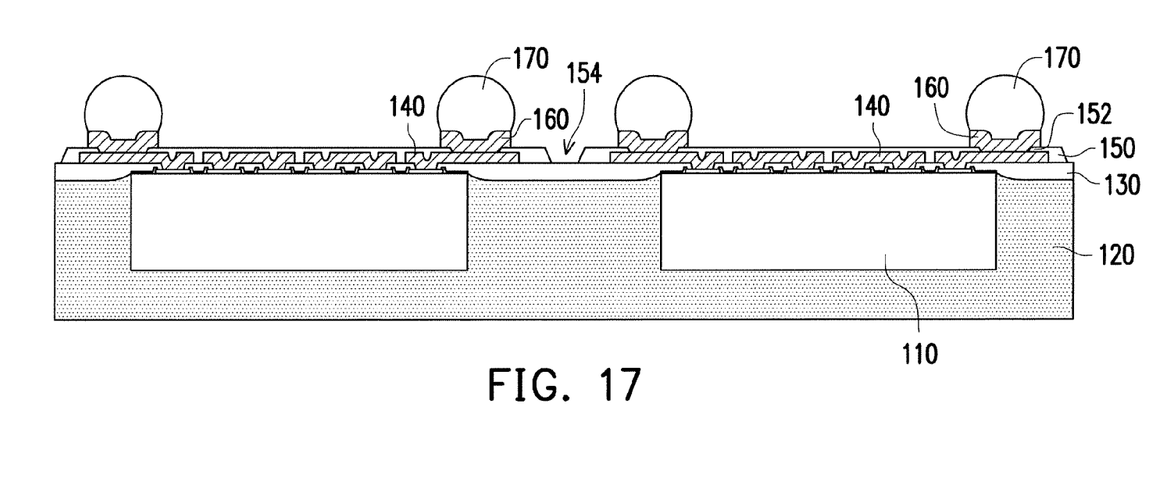
Figure 18:
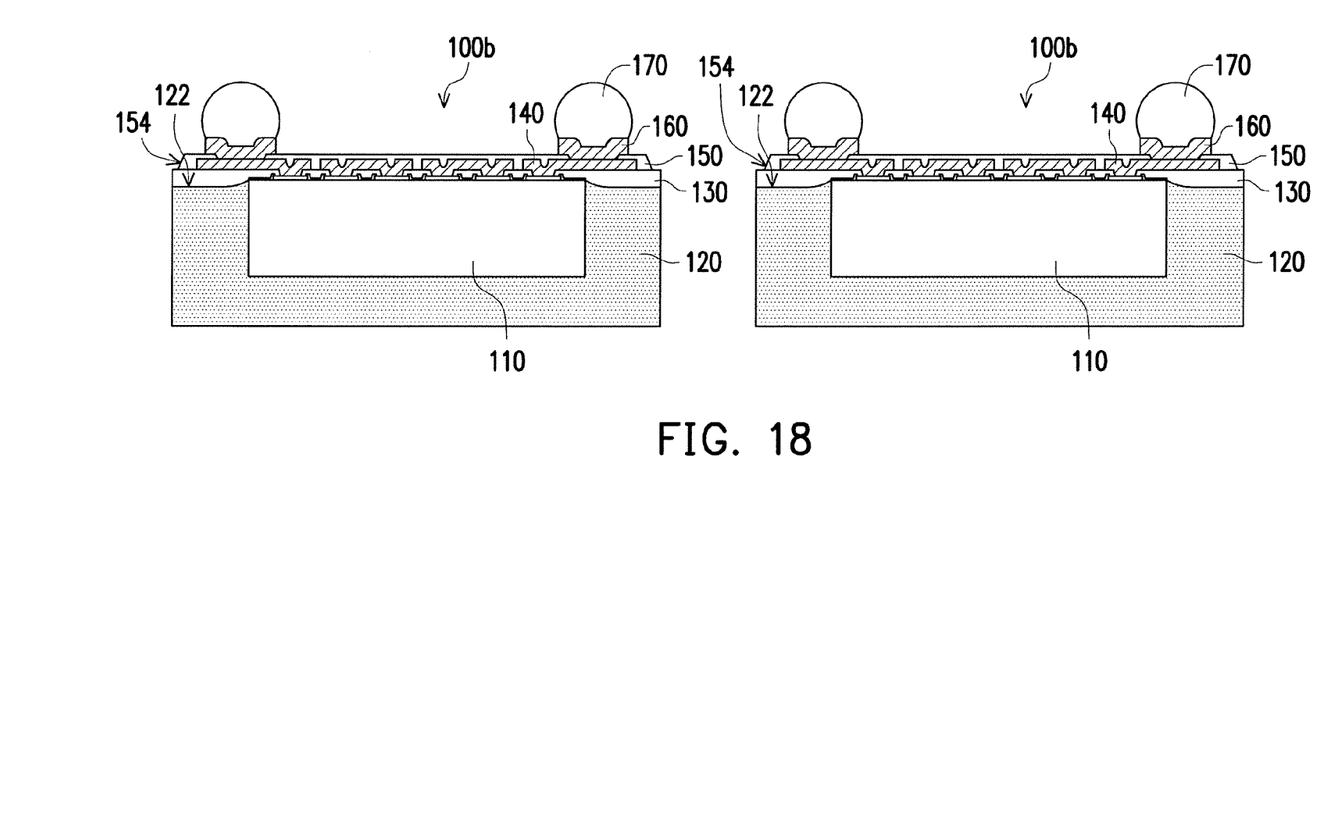

FIG. 16 to FIG. 18 illustrate cross-sectional views of a part of a manufacturing process of a chip package structure according to another embodiment of the invention. It is noted that the manufacturing process of the chip package structure 100a shown in FIG. 13 to FIG. 15 contains many features same as or similar to the manufacturing process of the chip package structure 100b disclosed earlier with FIG. 16 to FIG. 18. For purpose of clarity and simplicity, detail description of same or similar features may be omitted, and the same or similar reference numbers denote the same or like components.

In the present embodiment, the second dielectric layer 150 may further include a first scribe-line cut 154, which is arranged along an edge of the second dielectric layer 150. The first scribe-line cut 154 exposes an edge of the first dielectric layer 130 as shown in FIG. 16 and FIG. 17. Accordingly, when it comes to singularizing the chip package, the sawing process may be performed on the encapsulant 120 and the first dielectric layer 130 through the first scribe-line cut 154 to form a plurality of chip package structures 100b as shown in FIG. 18. As such, the sawing process is performed on the encapsulant 120 and the edge of first dielectric layer 130 exposed by the first scribe-line cut 154 without scribing the second dielectric layer 150, so as to avoid crack or damage to the first patterned circuit 140. Moreover, the first scribe-line cut 154 is able to release the stress between layers, so the delamination between the dielectric layers may be avoided. Also, in process panel or wafer warpage may be reduced. It is noted that the first scribe-line cut 154 may also be applied to the second dielectric layer 150 in the embodiment shown in FIG. 11 and FIG. 12 (without UBM layer 160). The present disclosure is not limited by the present embodiment.

In one embodiment, the first dielectric layer 130 may also include a scribe-line cut arranged along an edge of the first dielectric layer 130 and exposes a part of the encapsulant 120. In the embodiment, the size of the scribe-line cut of the first dielectric layer 130 may be larger than the first scribe-line cut 154, so the second dielectric layer 150 covers a part of the scribe-line cut of the first dielectric layer 130 and is conformal with the scribe-line cut of the first dielectric layer 130 to form the first scribe-line cut 154. The first scribe-line cut 154 also exposes a part of the encapsulant 120. Accordingly, when it comes to singularizing the chip package, the sawing process may be performed. As such, the sawing process may be performed on the exposed encapsulant 120 without scribing the first dielectric layer 130 and the second dielectric layer 150, so as to avoid crack or damage to the first patterned circuit 140. Moreover, the scribe-line cut of the first dielectric layer 130 and the first scribe-line cut 154 are able to release the stress between layers, so the delamination between the dielectric layers may be avoided, and in process panel or wafer warpage may be reduced.

Figure 19:
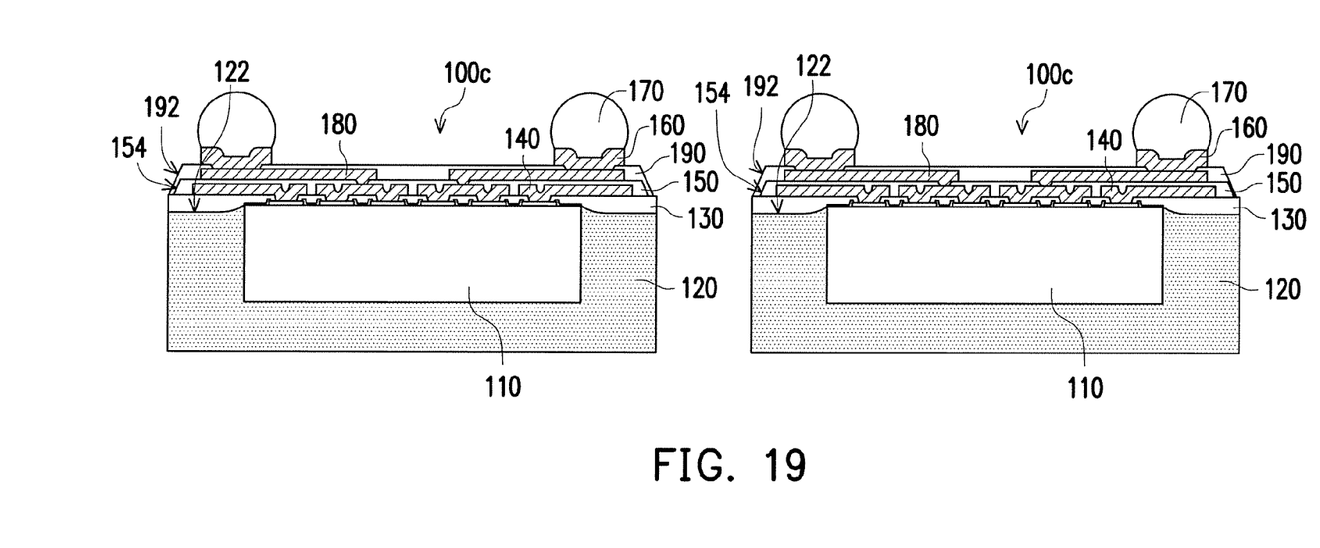
FIG. 19 illustrate cross-sectional views of a chip package structure according to another embodiment of the invention.

FIG. 19 illustrate a cross-sectional view of a chip package structure according to another embodiment of the invention. It is noted that the manufacturing process of the chip package structure 100c shown in FIG. 19 contains many features same as or similar to the manufacturing process of the chip package structure 100b disclosed earlier with FIG. 16 to FIG. 18. For purpose of clarity and simplicity, detail description of same or similar features may be omitted, and the same or similar reference numbers denote the same or like components.

In the present embodiment, a second patterned circuit layer 180 may further be formed on the second dielectric layer 150. The second patterned circuit layer 180 is electrically connected to the first patterned circuit layer 140 through the second openings 152. Then, a third dielectric layer 190 may be formed on the second dielectric layer 150. The third dielectric layer 190 includes a plurality of third openings and a second scribe-line cut 192. The third openings expose a part of the second patterned circuit layer 180. The solder balls 170 and/or the UBM layer 160 may be disposed on and electrically connected to the second patterned circuit layer 180 through the third openings. The second scribe-line cut 192 is arranged along an edge of the third dielectric layer 190 and conformal with the first scribe-line cut 154. Namely, the third dielectric layer 190 covers the surface of the first scribe-line cut 154 and is conformal with the first scribe-line cut 154 to form the second scribe-line cut 192 exposing the edge of the first dielectric layer 130.

Accordingly, when it comes to singularizing the chip package, the sawing process may be performed on the encapsulant 120 and the first dielectric layer 130 through the second scribe-line cut 192 to form a plurality of chip package structures 100c as shown in FIG. 19. In other words, the sawing process is performed on the encapsulant 120 and the edge of first dielectric layer 130 exposed by the second scribe-line cut 192 without scribing the second dielectric layer 150 and the third dielectric layer 190, so as to avoid crack or damage to the first patterned circuit 140 and the second patterned circuit 180. Moreover, the scribe-line cuts 154, 192 may be able to release the stress between layers. The delamination between the dielectric layers may then be avoided and in process panel or wafer warpage may be reduced. It is noted that the present embodiment is merely for illustration, the disclosure does not limit the number of the dielectric layers.

For the present disclosure, the chip is mounted on the carrier with the adhesive layer on top, the chips are mounted on the carrier by a force higher than a normal die bond force. The chips are partially buried into the adhesive layer and the adhesive layer located between the chips slightly bulges up. As such, the encapsulant formed to encapsulate the chip and cover the bulged-up adhesive layer includes a concave surface dented toward the back surface of the encapsulant due to the bulged-up adhesive layer. Then, the carrier is removed and the dielectric layer is formed to cover the concave surface of the encapsulant and the active surface of the chip. The contact surface area between the encapsulant and the dielectric layer may be increased to enhance the bonding strength between the encapsulant and the dielectric layer.

In addition, the dielectric layer includes the openings with slanted side surface to partially expose the electrical contacts underneath. The size of each opening is gradually increased from the bottom end of each opening to the top end of each opening to improve the step coverage of the subsequent PVD process for forming the patterned circuit layer and also improve the bonding strength between the patterned circuit layer and the dielectric layer. Therefore, the chip package structure and the manufacturing method thereof in the disclosure improve the yield and the reliability of the chip package structure.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A chip package structure, comprising:
a chip comprising an active surface, a back surface opposite to the active surface, and a plurality of pads disposed on the active surface;
an encapsulant encapsulating the back surface and at least one lateral surface of the chip, and exposing active surface, wherein the encapsulant comprises a concave surface and a back surface opposite the concave surface, the concave surface exposes the active surface and has at least one dent having a curvature toward the back surface;
a first dielectric layer covering the concave surface and the active surface, the first dielectric layer comprising a plurality of first openings exposing the plurality of pads and a surface away from the active surface, wherein the first opening comprises a first slanted side surface and an angle between the first slanted side surface and the surface of the first dielectric layer is an acute angle;
a first patterned circuit layer disposed on the first dielectric layer and electrically connected to the pads through the first openings; and
a second dielectric layer, disposed on the first patterned circuit layer and the first dielectric layer, wherein the second dielectric layer comprises a plurality of second openings exposing a part of the first patterned circuit layer, wherein the second dielectric layer further comprises a first scribe-line cut arranged along an edge of the second dielectric layer, and the first scribe-line cut exposes an edge of the first dielectric layer, and wherein a sidewall of the first scribe-line cut is recessed laterally from the edge of the first dielectric layer.

2. The chip package structure as claimed in claim 1, wherein a maximum distance from the concave surface to a surface coplanar with the active surface along a normal direction of the active surface is substantially from 2 μm to 5 μm.

3. The chip package structure as claimed in claim 1, wherein the first dielectric layer entirely contacts the concave surface.

4. The chip package structure as claimed in claim 1, wherein the angle is substantially from 60 degrees to 80 degrees.

5. The chip package structure as claimed in claim 1, wherein the second opening comprises a second slanted side surface and the angle between the second slanted side surface and the active surface is an acute angle.

6. The chip package structure as claimed in claim 5, wherein the angle between the second slanted side surface and the active surface is substantially from 60degrees to 80 degrees.

7. The chip package structure as claimed in claim 1, further comprising a plurality of solder balls disposed on the second openings and electrically connected to the first patterned circuit layer through the second openings.

8. The chip package structure as claimed in claim 1, further comprising a UBM (Under Bump Metallurgy) layer disposed on the second openings and electrically connected to the first patterned circuit layer through the second openings.

9. The chip package structure as claimed in claim 8, further comprising a plurality of solder balls disposed on and electrically connected to the UBM layer.

10. The chip package structure as claimed in claim 1, further comprising:
a second patterned circuit layer disposed on the second dielectric layer and electrically connected to the first patterned circuit layer through the second openings; and
a third dielectric layer disposed on the second dielectric layer, and comprising a plurality of third openings and a second scribe-line cut, wherein the third openings expose a part of the second patterned circuit layer, the second scribe-line cut is arranged along an edge of the third dielectric layer and conformal with the first scribe-line cut, and the second scribe-line cut exposes the edge of the first dielectric layer.

\* \* \* \* \*